United States Patent
Carta et al.

(10) Patent No.: US 9,425,298 B2
(45) Date of Patent: Aug. 23, 2016

(54) LATERAL BIPOLAR TRANSISTOR

(71) Applicant: International Business Machines Corporation, Armonk, NY (US)

(72) Inventors: Fabio Carta, White Plains, NY (US); Daniel C. Edelstein, White Plains, NY (US); Stephen M. Gates, Ossining, NY (US); Bahman Hekmatshoartabari, White Plains, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/602,799

(22) Filed: Jan. 22, 2015

(65) Prior Publication Data

US 2016/0218200 A1    Jul. 28, 2016

(51) Int. Cl.
*H01L 23/48* (2006.01)
*H01L 29/735* (2006.01)
*H01L 29/08* (2006.01)
*H01L 29/10* (2006.01)
*H01L 29/423* (2006.01)
(Continued)

(52) U.S. Cl.
CPC ....... *H01L 29/735* (2013.01); *H01L 21/02233* (2013.01); *H01L 21/02255* (2013.01); *H01L 21/2251* (2013.01); *H01L 21/31051* (2013.01); *H01L 21/31111* (2013.01); *H01L 23/291* (2013.01); *H01L 23/3171* (2013.01); *H01L 29/0649* (2013.01); *H01L 29/0808* (2013.01); *H01L 29/0821* (2013.01); *H01L 29/1008* (2013.01); *H01L 29/42304* (2013.01); *H01L 29/6625* (2013.01)

(58) Field of Classification Search
CPC .......... H01L 21/02233; H01L 21/02255; H01L 21/2251; H01L 21/31051; H01L 21/31111; H01L 23/391; H01L 23/3171; H01L 29/6625; H01L 29/735; H01L 29/0649; H01L 29/42304; H01L 29/1008; H01L 29/0821; H01L 29/0808
See application file for complete search history.

(56) References Cited

U.S. PATENT DOCUMENTS 5,567,631 A    10/1996   Hsu et al.
6,174,779 B1    1/2001   Shino et al.
(Continued)

OTHER PUBLICATIONS

Cai, Complementary Thin-Base Symmetric Lateral Bipolar Transistors on SOI, 2011, pp. 16.3.1-16.3.4, IEEE Electron Devices Meeting (IEDM), IEDM11-386-389.
(Continued)

*Primary Examiner* — Nicholas Tobergte
(74) *Attorney, Agent, or Firm* — Alexander G. Jochym

(57) ABSTRACT

A bipolar junction transistor comprises a semiconductor layer disposed on an insulating material, at least a portion of the semiconductor layer forming a base region. The bipolar junction transistor further comprises a transistor emitter laterally disposed on a first side of the base region, where in the transistor emitter is a first doping type and has a first width, and wherein the first width is a lithographic feature size. The bipolar junction transistor further comprises a transistor collector laterally disposed on a second side of the base region, wherein the transistor collector is the first doping type and the first width. The bipolar junction transistor further comprises a central base contact laterally disposed on the base region between the transistor emitter and the transistor collector, wherein the central base contact is a second doping type and has a second width, and wherein the second width is a sub-lithographic feature size.

9 Claims, 7 Drawing Sheets

(51) Int. Cl.
   *H01L 29/06*   (2006.01)
   *H01L 23/29*   (2006.01)
   *H01L 23/31*   (2006.01)
   *H01L 21/311*  (2006.01)
   *H01L 29/66*   (2006.01)
   *H01L 21/3105* (2006.01)
   *H01L 21/02*   (2006.01)
   *H01L 21/225*  (2006.01)

(56) References Cited

U.S. PATENT DOCUMENTS

| | | |
|---|---|---|
| 6,440,788 B2 | 8/2002 | Mandelman et al. |
| 6,653,714 B2* | 11/2003 | Matsuno ............ H01L 29/7317 257/557 |
| 8,486,797 B1 | 7/2013 | Hekmatshoartabari et al. |
| 8,502,347 B1 | 8/2013 | Hekmatshoartabari et al. |
| 8,531,001 B2 | 9/2013 | Cai et al. |
| 8,557,670 B1 | 10/2013 | Cai et al. |
| 2003/0121468 A1* | 7/2003 | Boone .................... C30B 23/02 117/78 |
| 2004/0214415 A1* | 10/2004 | Pellizzer ......... H01L 21/823835 438/583 |
| 2013/0313551 A1 | 11/2013 | Hekmatshoar-Tabari et al. |
| 2013/0313552 A1 | 11/2013 | Hekmatshoar-Tabari et al. |
| 2013/0316520 A1 | 11/2013 | Hekmatshoar-Tabari et al. |
| 2014/0117420 A1* | 5/2014 | Chen ................... H01L 23/5222 257/288 |
| 2015/0108422 A1* | 4/2015 | Pellizzer ............ H01L 27/1022 257/5 |
| 2015/0280117 A1* | 10/2015 | Boniardi ............... H01L 45/128 257/5 |

OTHER PUBLICATIONS

Ning, "On the Performance and Scaling of Symmetric Lateral Bipolar Transistors on SOI", Jan. 2013, pp. 21-27, IEEE Journal of the Electron Devices Society, vol. 1, No. 1.

* cited by examiner

LATERAL BIPOLAR TRANSISTOR

FIELD OF THE INVENTION

The present invention relates generally to the fabrication of semiconductor devices, and more particularly to the fabrication of a lateral bipolar transistor.

BACKGROUND OF THE INVENTION

A bipolar junction transistor (BJT) is a three-terminal electronic device constructed of doped semiconductor materials, which may be used in amplifying or switching applications. The operation of bipolar junction transistors includes both electrons and holes. Charge flow in a BJT is due to bidirectional diffusion of charge carriers across a junction between two regions of different charge concentrations. The mode of operation of a BJT is contrasted with unipolar transistors, such as field effect transistors, in which only one carrier type is involved in charge flow due to drift. By design, most of the BJT collector current is due to the flow of charges injected from a high-concentration emitter into the base where there are minority carriers that diffuse toward the collector.

Conventional epitaxial semiconductor growth of the doped regions of a BJT typically requires high temperatures (generally much greater than 600° C.). Depending on the application, the high epitaxial growth temperature may have any or all of the following drawbacks: degradation of minority carrier lifetime, creation of structural defects, undesired impurity diffusion resulting in junction widening, relaxation of strain, or generation of undesirable strain resulting in buckling or delamination.

SUMMARY

Embodiments of the present invention include a bipolar junction transistor and a method of making the same. The bipolar junction transistor comprises a semiconductor layer disposed on an insulating material, at least a portion of the semiconductor layer forming a base region. The bipolar junction transistor further comprises a transistor emitter laterally disposed on a first side of the base region, where in the transistor emitter is a first doping type and has a first width, and wherein the first width is a lithographic feature size. The bipolar junction transistor further comprises a transistor collector laterally disposed on a second side of the base region, wherein the transistor collector is the first doping type and has the first width. The bipolar junction transistor further comprises a central base contact laterally disposed on the base region between the transistor emitter and the transistor collector, wherein the central base contact is a second doping type and has a second width, and wherein the second width is a sub-lithographic feature size.

The method of making the bipolar junction transistor includes providing a semiconductor layer on an insulating material, wherein the semiconductor layer forms a base region. Next, depositing a passivation layer on the base region. Next etching two or more openings in the passivation layer, wherein the two or more openings have a width of a lithographic feature size and expose the base region. Lastly, epitaxially growing a first doped layer in the two or more openings in the passivation layer, wherein the first doped layer is a first doping type.

DETAILED DESCRIPTION

Figure 1:
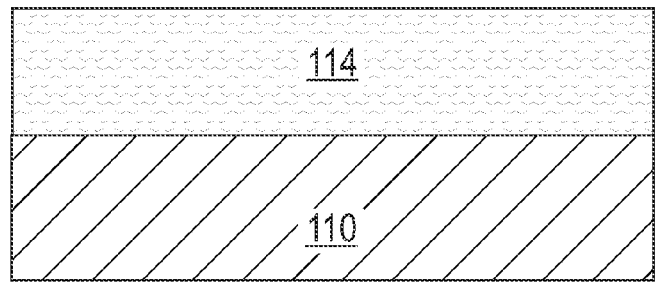
FIG. 1 is a pictorial representation (through a cross-sectional view) depicting a structure including a passivation layer located atop a crystalline semiconductor substrate, in accordance with an embodiment of the present invention.

Embodiments of the present invention generally provide a new process of forming bipolar junction transistors (BJT). Additionally, embodiments of the present invention provide a lateral bipolar transistor in which the base width, w, is formed at sub-lithographic dimensions. The lithographic feature size or smallest dimension printed is F. Within this invention, w is given by the formula, $w=F-2*s$. The spacer width is s, wherein a dielectric spacer of thickness s has been introduced.

Embodiments of the present invention realize that scaling of the lateral BJT device structure to dimensions below the feature sizes used in the lithography remains a problem. Particularly, in applications where a poly-crystalline channel material is desired instead of a single crystalline material, for example in a back-end-of-the-line integrated device, scaling has benefits to performance. Specifically, embodiments of the present invention realize the desire to scale down the base width to make it sufficiently smaller than the diffusion length of minority carriers in the poly-crystalline base. The presence of structural defects in poly-Si results in shorter minority carrier recombination times and therefore shorter diffusion lengths in poly-crystalline materials compared to a single-crystalline material and therefore a small based width may be advantageous. Embodiment of the present invention are discussed related to an n-p-n transistor and embodiments of the present invention can be performed in a p-n-p transistor as well, as known in the art.

Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term non-crystalline refers to amorphous, nano-crystalline or micro-crystalline. The term crystalline refers to single-crystalline (i.e., mono-crystalline) or poly-crystalline (i.e., multi-crystalline).

Reference is now made to FIGS. 1-8, which illustrate a selective method of forming a bipolar junction transistor, in accordance with an embodiment of the present invention. In the selective method, a patterned passivation layer 114 is formed on an exposed surface of a crystalline semiconductor substrate 110. Next, an n-type dopant layer 118 is epitaxially grown from the exposed surfaces of the crystalline semiconductor substrate 110. A high-k dielectric layer 120 is then deposited conformally over the passivation layer 114. Chemical-mechanical planarization is then used to remove the high-k dielectric layer 120 to the height of the passivation layer 114. The passivation layers 114, between n-type dopant layers 118, are etched forming openings 122 to expose at least one portion of the surface of the crystalline semiconductor substrate 110, between the 2 n-type contacts. A spacer 124 is formed adjacent the n-type dopant layer 118 in the exposed area, within opening 122. The spacer is formed by conformal deposition and then anisotroic etch removal of the material, again exposing substrate 110. After surface cleaning steps, a p-type dopant layer 126 is epitaxially grown from the exposed surface of the crystalline semiconductor substrate 110.

All figures and embodiments described below make use of the base width, w, of the bipolar transistor, and w=F−2*s, where F is the feature size applied in the lithography step, and s is the sidewall thickness of the dielectric spacer. For example, when F=20 nm, the smallest dimension printed, a spacer thickness of 5 nm leads to w=10 nm, measurably less than F, and 10 nm is not printable using present lithography. In another example, when F is 10 nm, the smallest dimension printed, a spacer thickness of 2 nm leads to w=6 nm, measurably less than F, and w=6 nm is smaller than any practical lithographic dimension. As known in the art, F can have a range of values, for example 10 to 100 nm. Using this invention, the bipolar transistor has base width w from 2 to 98 nm, for example, and the restriction is that w is measurably smaller than F.

Referring to FIG. 1, there is a pictorial representation (through a cross-sectional view) depicting a structure including a passivation layer 114 located atop a crystalline semiconductor substrate 110, in accordance with an embodiment of the present invention. The term "crystalline" is used herein to denote a single crystal material, a multi-crystalline material or a polycrystalline material. Typically, the crystalline semiconductor substrate 110 is comprised of a single crystalline semiconductor material. The term "non-crystalline" is used herein to denote an amorphous, nano-crystalline or micro-crystalline material.

In one embodiment, the crystalline semiconductor substrate 110 that can be employed in embodiments of the present invention can be an III-V compound semiconductor which includes at least one element from IIIA (i.e., Group 13) of the Periodic Table of Elements and at least one element from Group VA (i.e., Group 15) of the Periodic Table of Elements. The range of possible formulae for suitable III-V compound semiconductors that can be used in the present invention is quite broad because these elements can form binary (two elements, e.g., gallium(III) arsenide (GaAs)), ternary (three elements, e.g., indium gallium arsenide (InGaAs)) and quaternary (four elements, e.g., aluminium gallium indium phosphide(AlInGaP)) alloys.

In another embodiment of the present invention, the crystalline semiconductor substrate 110 can be a semiconductor material having the formula $Si_yGe_{1-y}$ wherein y is $0 \leq y \leq 1$. In some embodiments, in which y is 1, the semiconductor substrate 110 can be comprised entirely of Si. In another embodiment, in which y is 0, the semiconductor substrate 110 can be comprised entirely of Ge. In yet another embodiment and when y is other than 0 or 1, the crystalline semiconductor substrate 110 can be comprised entirely of a SiGe alloy.

The crystalline semiconductor substrate 110 can be a bulk semiconductor material or it can be a semiconductor-on-insulator material which includes, from bottom to top, a handle substrate, a buried insulating layer, and a top semiconductor layer which is typically crystalline and is composed of either an III-V compound semiconductor, or a semiconductor material having the formula $Si_yGe_{1-y}$ wherein y is $0 \leq y \leq 1$. The handle substrate can be comprised of a same or different semiconductor material as the top semiconductor layer, while the buried insulating layer may be comprised of a semiconductor oxide, semiconductor nitride, semiconductor oxynitride or a multilayered stack thereof. The semiconductor-on-insulator substrate that can be employed in some embodiments of the present invention can be formed by ion implantation and annealing, or the semiconductor-on-insulator substrate can be formed utilizing a layered transfer process. The thickness of each of the layers forming the semiconductor-on-insulator substrate is within ranges that are typically used for fabricating semiconductor structures.

The crystalline semiconductor substrate 110, or the top crystalline semiconductor layer of a semiconductor-on-insulator substrate, is of a first conductivity type which is either p-type or n-type, and the dopant concentration may be in the range from $1 \times 10^{17}/cm^3$ to $1 \times 10^{19}/cm^3$ within the invention. In an embodiment, this substrate doping is from 1 to $5 \times 10^{18}/cm^3$. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the semiconductor material of the crystalline semiconductor substrate 10 or the top crystalline semiconductor layer of a semiconductor-on-insulator substrate is p-type, the p-type dopant is present in a concentration ranging from $1 \times 10^9$ atoms/cm$^3$ to $1 \times 10^{20}$ atoms/cm$^3$. In another embodiment, in which the first conductivity type is p-type, the p-type dopant is present in a concentration ranging from $1 \times 10^{14}$ atoms/cm$^3$ to $1 \times 10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the semiconductor material of the crystalline semiconductor substrate 110 or the top crystalline semiconductor layer of a semiconductor-on-insulator substrate is n-type, the n-type dopant is present in a concentration ranging from $1\times10^9$ atoms/cm$^3$ to $1\times10^{20}$ atoms/cm$^3$. In another embodiment, in which the first conductivity type is n-type, the n-type dopant is present in a concentration ranging from $1\times10^{14}$ atoms/cm$^3$ to $1\times10^{19}$ atoms/cm$^3$.

The dopant concentration that provides the first conductivity type may be graded or uniform. By "uniform" it is meant that the dopant concentration is the same throughout the entire thickness of a semiconductor material that provides the crystalline semiconductor substrate 110 or the top crystalline semiconductor layer of a semiconductor-on-insulator substrate. For example, a crystalline semiconductor substrate 110 or the top crystalline semiconductor layer of a semiconductor-on-insulator substrate having a uniform dopant concentration may have the same dopant concentration at the upper surface and bottom surface of the semiconductor material that provides the crystalline semiconductor substrate 110 or the top crystalline semiconductor layer of a semiconductor-on-insulator substrate, as well as the same dopant concentration at a central portion of the semiconductor material between the upper surface and the bottom surface of the crystalline semiconductor substrate 110 or the top crystalline semiconductor layer of a semiconductor-on-insulator substrate. By "graded", it is meant that the dopant concentration varies throughout the thickness of the crystalline semiconductor substrate 110 or the top crystalline semiconductor layer of a semiconductor-on-insulator substrate. For example, a crystalline semiconductor substrate 110 or the top crystalline semiconductor layer of a semiconductor-on-insulator substrate having a graded dopant concentration may have an upper surface with a greater dopant concentration than the bottom surface of the crystalline semiconductor substrate 110 or the top crystalline semiconductor layer of a semiconductor-on-insulator substrate, and vice versa.

The first conductivity type can be introduced during the growth of the crystalline semiconductor material. Alternatively, the first conductivity type can be introduced into an intrinsic semiconductor material by utilizing ion implantation, and/or gas phase doping.

Next, a passivation layer 114 is provided on an exposed surface of the crystalline semiconductor substrate 110. The exposed surface can be a front side surface, a back side surface or on both a front side surface and a back side surface of the crystalline semiconductor substrate 110. In the drawings, the passivation layer 114 is shown on a front side surface, e.g., first surface, of the crystalline semiconductor substrate 110, while the back side surface, e.g., second surface which is opposite to the first surface, is bare. In some embodiments, the back side surface of the crystalline semiconductor substrate 110 can be processed to include other components of the bipolar junction transistor, e.g., a base contact and its associated electrode already formed thereon.

Notwithstanding the location of the passivation layer 114, the passivation layer 114 serves as a passivation layer to saturate dangling bonds on the surface of the crystalline semiconductor substrate 110, in order to reduce the recombination of carriers at the surface of the crystalline semiconductor substrate 110. The passivation layer 114 may also reduce the recombination of carriers at the surface of the crystalline semiconductor substrate 110 by "field-induced" passivation, for example, by repelling the minority carriers from the surface of the crystalline semiconductor substrate 110. Field-induced passivation may be facilitated by the presence of fixed electronic charges in the passivation layer, formation of dipoles at the passivation/substrate interface, or the electric field induced by the work function difference between the passivation layer and the substrate semiconductor material. The passivation layer 114 may also serve to prevent air or moisture from being introduced into the crystalline semiconductor substrate 110. The passivation layer 114 that can be employed in the present invention includes, for example, a hard mask material such as, for example, a semiconductor oxide, a semiconductor nitride, a semiconductor oxynitride, or a multilayered stack thereof. The passivation layer 114 may also be comprised of a high-k dielectric (k>silicon oxide) such as aluminum oxide or hafnium oxide. In some embodiments, more typical to III-V materials, the passivation layer 114 may be comprised of a substantially undoped semiconductor material having a larger bandgap than that of the crystalline semiconductor substrate 110 to passivate the surface of the crystalline semiconductor substrate 110 by repelling the minority carriers induced by the work function difference between the semiconductor materials formed by the passivation layer 114 and the crystalline semiconductor substrate 110. In other embodiments, the passivation layer 114 is comprised of silicon oxide, silicon nitride, and/or silicon oxynitride. The passivation layer 114 can have a thickness from 5 nm to 50 nm. Other thicknesses that are below or above the aforementioned thickness range can also be employed.

In one embodiment, the passivation layer 114 can be formed by a deposition process including, for example, chemical vapor deposition, plasma enhanced chemical vapor deposition, atomic layer deposition or chemical solution. In other embodiments, the passivation layer 114 can be formed utilizing a thermal technique such as, for example, oxidation and/or nitridation. In yet other embodiments, a combination of a deposition process and a thermal technique can be used to form the passivation layer 114. In still another embodiment, which is more typical to III-V materials, a substantially undoped semiconductor material having a larger bandgap than that of the crystalline semiconductor substrate 110 can be used as the passivation layer and such a material can be grown on the crystalline semiconductor substrate 110 by conventional growth techniques such as, for example, molecular beam epitaxy or metal-organic chemical vapor deposition. The passivation layer 114 that is formed at this stage of the present invention is a contiguous blanket layer.

Figure 2:
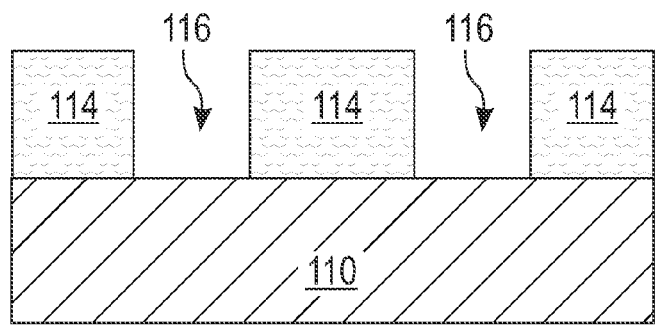
FIG. 2 is a pictorial representation (through a cross-sectional view) depicting the structure of FIG. 1 after forming at least one opening within the passivation layer that exposes at least one portion of the surface of the crystalline semiconductor substrate, in accordance with an embodiment of the present invention.

FIG. 2 is a pictorial representation (through a cross-sectional view) depicting the structure of FIG. 1, after forming at least one opening 116 within the passivation layer 114 that exposes at least one portion of the surface of the crystalline semiconductor substrate 110, in accordance with an embodiment of the present invention. The at least one opening 116 that can be formed into the passivation layer 114 may be an emitter contact opening, a collector contact opening, a base contact opening, or any combination thereof. In some embodiments, the width of each of that contact openings is in the range of 10 nm to 100 nm. In other embodiments, the width of each of the contact openings is in the range of 50 nm to 1 µm. In yet other embodiments, the width of the contact openings is in the range of 500 nm to 100 µm. Contact openings narrower than 10 nm or wider than 100 µm can also be employed.

The at least one opening 116 that is formed into the passivation layer 114 can be formed by lithography followed by etching. In an embodiment, the openings 116 have a smallest dimension F defined by the lithography step. Lithography includes forming a photoresist material (not shown) on an exposed surface of the passivation layer 114, exposing the photoresist material to a desired pattern of radiation and developing the photoresist material utilizing a conventional resist developer. The etching step, which transfers the pattern from the patterned photoresist into the passivation layer 114, is preferably dry etching for small features (i.e., reactive ion etching, ion beam etching, or plasma etching), and may include wet chemical etching, or a combination thereof. Typically, a reactive ion etch is used to transfer the pattern from the patterned photoresist into the passivation layer 114. After pattern transfer, the patterned photoresist is typically removed from the structure utilizing conventional stripping process such as, for example, ashing.

Figure 3:
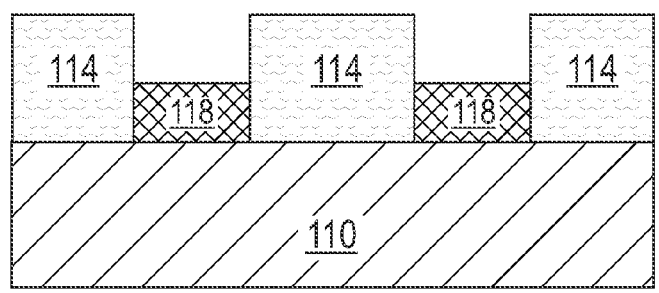
FIG. 3 is a pictorial representation (through a cross-sectional view) depicting the structure of FIG. 2 after growth of a n-type dopant layer in the at least one opening from the exposed portion of the surface of the crystalline semiconductor substrate, in accordance with an embodiment of the present invention.

FIG. 3 is a pictorial representation (through a cross-sectional view) depicting the structure of FIG. 2 after growth of a n-type dopant layer 118 in the at least one opening 116 from the exposed portion of the surface of the crystalline semiconductor substrate 110, in accordance with an embodiment of the present invention. An n-type dopant layer 118, described previously, is epitaxially grown in the at least one opening 116 from the exposed portion of the surface of the crystalline semiconductor substrate 110, after cleaning steps are applied to said surface. Epitaxially forming the n-type dopant layer 118 involves using a process such as molecular beam epitaxy (MBE), metal organic chemical vapor deposition (MOCVD), atomic layer deposition (ALD), or any other technique for epitaxially growing a layer of semiconductor material. The n-type dopant layer 118 is formed to a height lower than the height of the passivation layer 114. The n-type dopant layer 118 may have a dopant concentration in the range from $5\times10^{18}/cm^3$ to $5\times10^{20}/cm^3$ within the invention and a good working range is $5\times10^{19}/cm^3$ to $5\times10^{20}/cm^3$. This concentration is higher than the dopant concentrate in the crystalline semiconductor substrate 110, discussed previously.

The dopant concentration within dopant layer 118 may be uniform, or may have a gradient in concentration referenced to the surface of crystalline semiconductor substrate 110. In an embodiment, the leakage at each p/n junction is reduced using a low doped n-type region at the interface to crystalline semiconductor substrate 110, followed by a highly doped n-type layer further from the interface (not shown).

Figure 4:
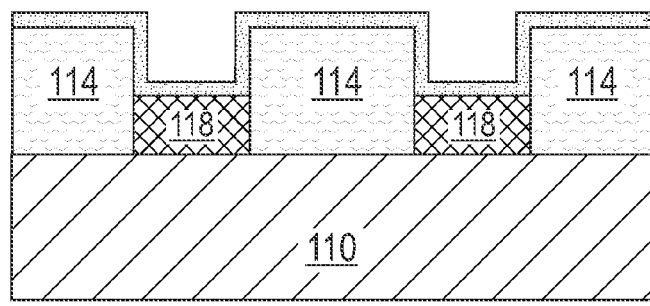
FIG. 4 is a pictorial representation (through a cross-sectional view) depicting depositing of a high-k dielectric material over the structure of FIG. 3, in accordance with an embodiment of the present invention.
Figure 5:
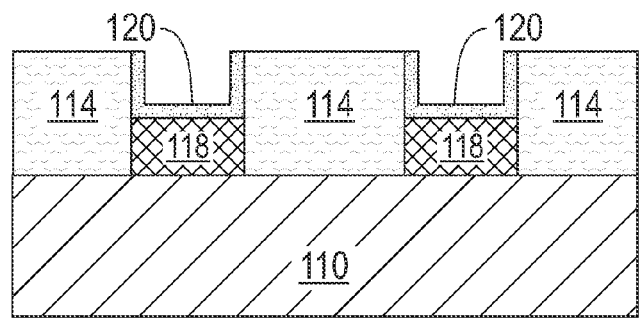
FIG. 5 is a pictorial representation (through a cross-sectional view) depicting the structure of FIG. 4 after chemical-mechanical planarization to the height of the passivation layer, in accordance with an embodiment of the invention.

FIG. 4 is a pictorial representation (through a cross-sectional view) depicting depositing of a high-k dielectric material 120 over the structure of FIG. 3, in accordance with an embodiment of the present invention. A high-k dielectric material is a material with a high dielectric constant k, for example hafnium oxide ($HfO_2$). The high-k dielectric material 120 is conformally deposited on the surface of the n-type dopant layer 118, and the exposed top and sidewall surface of the passivation layer 114, preferably using an atomic layer deposition (ALD) process because ALD has the conformality required. In alternative embodiments, the high-k dielectric material may be comprised of aluminum oxide, titanium oxide, or silicon nitride, and is preferably deposited using an atomic layer deposition (ALD) process. Any metal oxide that is conformal and resistant to a silicon oxide etch may be used within the invention. In an alternative embodiment, a thin layer of N±α-SiH (not shown) may be deposited on the n-type dopant layer 118 first to improve transistor gain and then the high-k dielectric material 120 is deposited on top of the thin layer of N±α-SiH (not shown). The hydrogenated non-crystalline silicon containing material may include one or more of the following elements: Germanium, Carbon, Flourine, Chlorine, Nitrogen, Oxygen, or Deuterium FIG. 5 is a pictorial representation of (through a cross-sectional view) depicting the structure of FIG. 4 after chemical-mechanical planarization to the height of the passivation layer 114, in accordance with an embodiment of the present invention. The chemical-mechanical planarization removes the high-k dielectric material 120 that is located anywhere above the top of the passivation layer 114. Chemical-mechanical planarization (CMP) may be used to reduce the height variations in the topography of deposited high-k dielectric material 120, however, variations may still be present. CMP may use a combination of chemical etching and mechanical polishing to smooth the surface and even out any irregular topography. In a preferred embodiment, the height of the top surface of the high-k dielectric material 120 will be coplanar to the height of the top surface of the passivation layer 114, as shown in FIG. 5.

Figure 6:
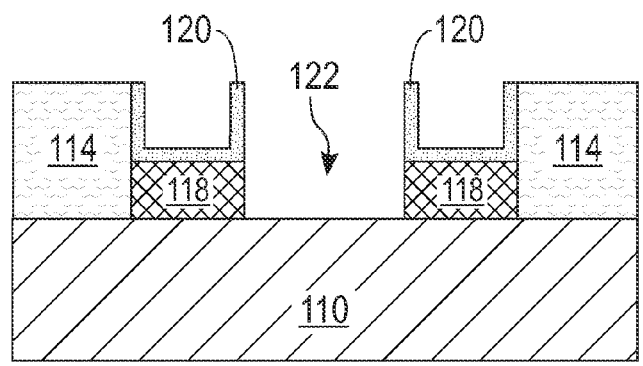
FIG. 6 is a pictorial representation (through a cross-sectional view) depicting the structure of FIG. 5 after etching the passivation layer between the n-type dopant layer that exposes at least one portion of the surface of the crystalline semiconductor substrate, in accordance with an embodiment of the invention.

FIG. 6 is a pictorial representation of (through a cross-sectional view) depicting the structure of FIG. 5 after etching the passivation layer 114 between the n-type dopant layer 118 that exposes at least one portion of the surface of the crystalline semiconductor substrate 110, in accordance with an embodiment of the present invention. The etching performed is similar to the etching described above in FIG. 2. The etching process creates an opening 122 that is formed from the exposed portion of the surface of the crystalline semiconductor substrate 110, the exposed sidewalls of the n-type dopant layer 118, and the exposed sidewalls of the high-k dielectric material 120. In an embodiment, the opening 122 has a smallest dimension (F) defined by the lithography step.

Figure 7:
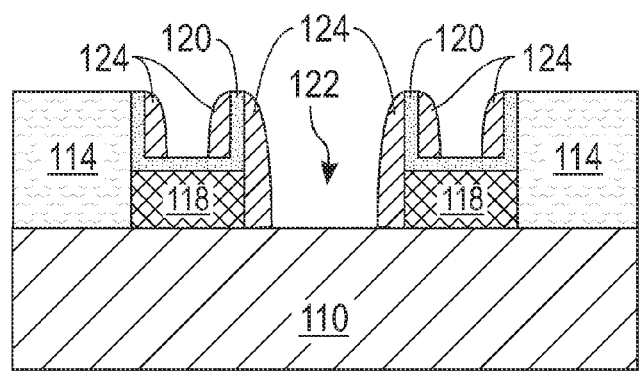
FIG. 7 is a pictorial representation (through a cross-sectional view) depicting the structure of FIG. 6 with a formed spacer, in accordance with an embodiment of the present invention.

FIG. 7 is a pictorial representation (through a cross-sectional view) depicting the structure of FIG. 6 with formed spacers 124, in accordance with an embodiment of the present invention. Forming dielectric spacers 124 may include depositing a conformal layer (not shown) of insulating material, such as silicon nitride, over crystalline semiconductor substrate 110, n-type dopant layer 118, and high-k dielectric material 120, such that the thickness of the deposited layer (not shown) on the sidewall of the n-type dopant layer 118 and high-k dielectric material 120 is substantially the same as the thickness of the deposited layer (not shown) on the surface of crystalline semiconductor substrate 110. An anisotropic etch process, where the etch rate in the downward direction is greater than the etch rate in the lateral direction, may be used to remove portions of the insulating layer, thereby forming dielectric spacer 124. In an embodiment, the opening 122 now has a dimension on the surface of 110 that is smaller than defined by the lithography step, specifically this dimension is called w, the base width and w=F−2*s, where F is the feature size applied in the lithography step, and s is the sidewall thickness of the dielectric spacer, as covered in detail below.

Figure 8:
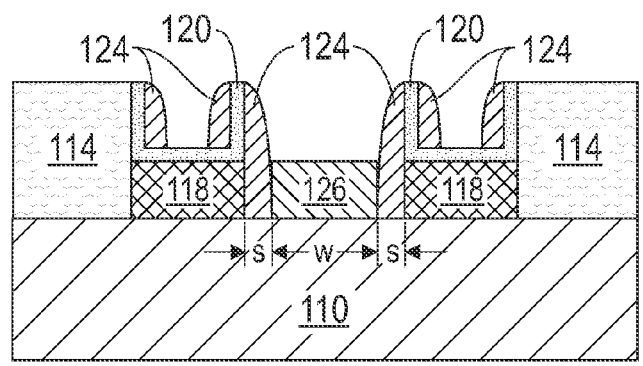
FIG. 8 is a pictorial representation (through a cross-sectional view) depicting the structure of FIG. 7 after growth of a p-type dopant layer between the n-type dopant layer and formed spacer from the exposed at least one portion of the surface of the crystalline semiconductor substrate, in accordance with an embodiment of the present invention.

FIG. 8 is a pictorial representation (through a cross-sectional view) depicting the structure of FIG. 7 after growth of a p-type dopant layer 126 between the n-type dopant layer 118 and the formed spacer 124 from the exposed at least one portion of the surface of the crystalline semiconductor substrate 110, in accordance with an embodiment of the present invention. A p-type dopant layer 126, describe previously, is epitaxially grown in the opening 122 from the exposed portion of the surface of the crystalline semiconductor substrate 110. Epitaxially forming the p-type dopant layer 126 involves using a process such as molecular beach epitaxy (MBE), metal organic chemical vapor deposition (MOCVD), thermal chemical vapor deposition, plasma enhanced chemical vapor deposition (PECVD), liquid phase epitaxy, atomic layer deposition (ALD), or any other technique for epitaxially growing a layer of semiconductor material. The p-type dopant layer 126 may have a dopant concentration in the range from $5\times10^{18}/cm^3$ to $5\times10^{20}/cm^3$ within the invention and a good working range is $5\times10^{19}/cm^3$ to $5\times10^{20}/cm^3$. This concentration is higher than the dopant concentrate in the crystalline semiconductor substrate 110, discussed previously. The dopant concentration within p-type dopant layer 126 may be uniform, or may have a gradient in concentration referenced to the surface of crystalline semiconductor substrate 110. In an embodiment, the leakage at each p/n junction is reduced using a low doped p-type region at the interface to crystalline semiconductor substrate 110, followed by a highly doped p-type layer further from the interface (not shown).

As shown in FIG. 8, the base width, w, of the p-type dopant layer is formed at sub-lithographic dimensions. The lithographic feature size or smallest dimension printed is represented by F. Unique to this invention, the base width is measurably smaller than F and is determined by the formula, w=F−2*s. The dielectric spacer width is s. Upon completion of the above described selective method of forming the bipolar junction transistor, electrical wiring contacts are formed to each base, emitter and collector, and then other devices and components may be formed on crystalline semiconductor substrate 110 and interconnected using one or more wiring layers. The formation of low resistance contacts and patterned wiring layers follows methods known in the art.

Reference is now made to FIGS. 9-15, which illustrate a selective method of forming a bipolar junction transistor in accordance with an embodiment of the present invention. In the selective method, a patterned high-k dielectric material 214 is formed on an exposed surface of a crystalline semiconductor substrate 210. Next, an n-type dopant layer 218 is epitaxially grown from the exposed surfaces of the crystalline semiconductor substrate 210. A thermal oxide layer 220 is then created using thermal oxidation and diffusion 221 of the n-type dopant layer 218 occurs in the crystalline semiconductor substrate 210. The high-k dielectric material 214 between the n-type dopant layers 218 is etched to expose at least one portion of the surface of the crystalline semiconductor substrate 210. A dielectric spacer 224 is formed adjacent to the n-type dopant layer 218 in the exposed area. A p-type dopant layer 226 is epitaxially grown from the exposed surface of the crystalline semiconductor substrate 210.

Figure 9:
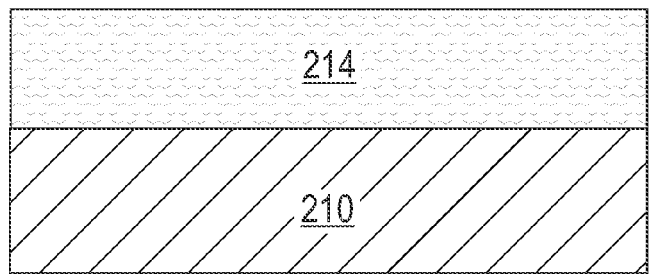
FIG. 9 is a pictorial representation (through a cross-sectional view) depicting a structure including a high-k dielectric material located atop a crystalline semiconductor substrate, in accordance with another embodiment of the present invention.

Referring to FIG. 9, there is a pictorial representation (through a cross-sectional view) depicting a structure including a high-k dielectric material 214 located atop a crystalline semiconductor substrate 210, in accordance with an embodiment of the present invention. Crystalline semiconductor substrate 210 is similar to crystalline semiconductor substrate 110, discussed previously. High-k dielectric material 214 is similar to high-k dielectric material 120, discussed previously.

Figure 10:
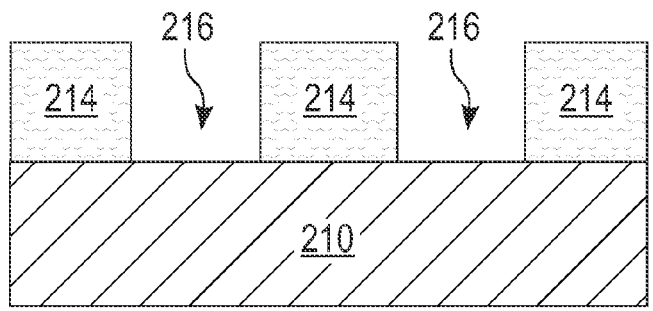
FIG. 10 is a pictorial representation (through a cross-sectional view) depicting the structure of FIG. 9 after forming at least one opening within the high-k dielectric material that exposes at least one portion of the surface of the crystalline semiconductor substrate, in accordance with another embodiment of the present invention.

Referring to FIG. 10, there is a pictorial representation (through a cross-sectional view) depicting the structure of FIG. 9, after forming at least one opening 216 within the high-k dielectric material 214 that exposes at least one portion of the surface of the crystalline semiconductor substrate 210, in accordance with an embodiment of the present invention. The forming of at least one opening 216 is similar to the formation of the at least one opening 116, discussed previously.

Figure 11:
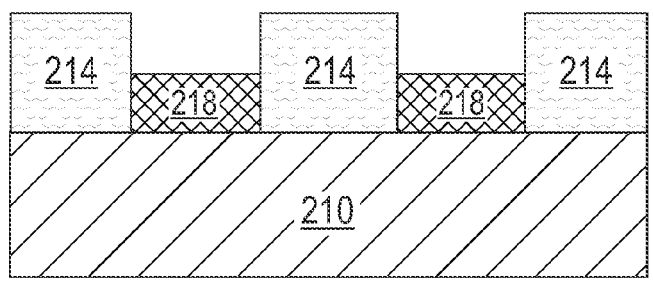
FIG. 11 is a pictorial representation (through a cross-sectional view) depicting the structure of FIG. 10 after growth of a n-type dopant in the at least one opening from the exposed portion of the surface of the crystalline semiconductor substrate, in accordance with another embodiment of the present invention.

Referring to FIG. 11, there is a pictorial representation (through-a cross-sectional view) depicting the structure of FIG. 10 after growth of a n-type dopant layer 218 in the at least one opening 216 from the exposed portion of the surface of the crystalline semiconductor substrate 210, in accordance with an embodiment of the present invention. The n-type dopant layer 218 is similar to the n-type dopant layer 118, described previously, and is epitaxially grown in a similar fashion. The n-type dopant layer 218 may be formed to a height lower or higher than the height of the high-k dielectric material 214.

Figure 12:
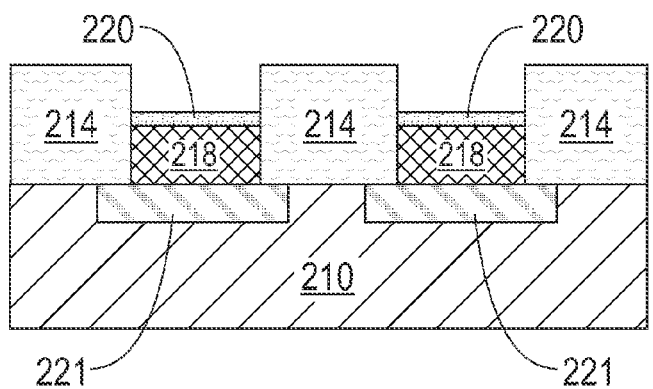
FIG. 12 is a pictorial representation (through a cross-sectional view) depicting the structure of FIG. 11 after thermal oxidation of the exposed n-type dopant layer including diffusion into the crystalline semiconductor substrate, in accordance with another embodiment of the present invention.

Referring to FIG. 12, there is a pictorial representation (through a cross-sectional view) depicting the structure of FIG. 11, after thermal oxidation of the exposed n-type dopant layer 218 including diffusion 221 into the crystalline semiconductor substrate 210, in accordance with an embodiment of the present invention. Thermal oxidation is used to produce a thin layer of oxide 220 on the surface of the n-type dopant layer 218. The technique forces an oxidizing agent to create dopant diffusion 221 into the crystalline semiconductor substrate 210 at high temperature. A method of forming the thin layer of oxide 220 by thermal oxidation may be a "dry oxidation" method of thermal oxidation in a pure oxygen atmosphere, forming the oxide film by a pyrogenic oxidation method—combusting oxygen and hydrogen in a combustion chamber, adding pure water vapor ($H_2O$) to an atmosphere gas, flowing the same into a reaction chamber and causing thermal oxidation—or a "wet oxidation" method.

Figure 13:
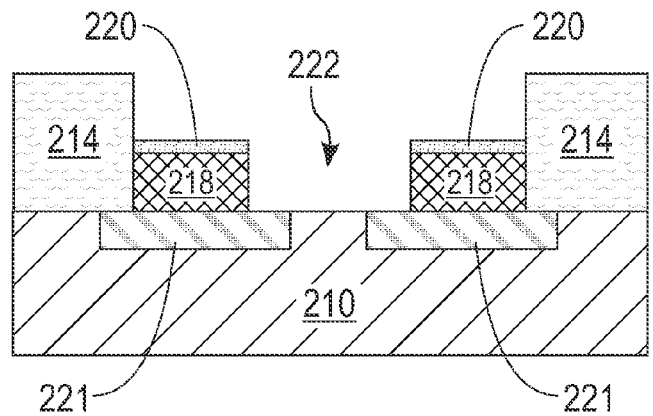
FIG. 13 is a pictorial representation (through a cross-sectional view) depicting the structure of FIG. 12 after etching the high-k dielectric material between the n-type dopant layer that exposes at least one portion of the surface of the crystalline semiconductor substrate, in accordance with another embodiment of the invention.

Referring to FIG. 13, there is a pictorial representation (through a cross-sectional view) depicting the structure of FIG. 12 after etching the high-k dielectric material 214 between the n-type dopant layers 218 that exposes at least one portion of the surface of the crystalline semiconductor substrate 210, in accordance with an embodiment of the present invention. The etching performs a function similar to the etching described above in FIG. 2 and FIG. 6, but the removed dielectric is different from FIG. 2 and FIG. 6. The etching process creates an opening 222 that is formed from the exposed portion of the surface of the crystalline semiconductor substrate 210, the exposed sidewalls of the n-type dopant layer 218, and the exposed sidewalls of the thin layer of oxide 220. In an embodiment, the opening 222 has a dimension larger than the base width, w, and optionally this dimension is equal to the lithographic feature size, F.

Figure 14:
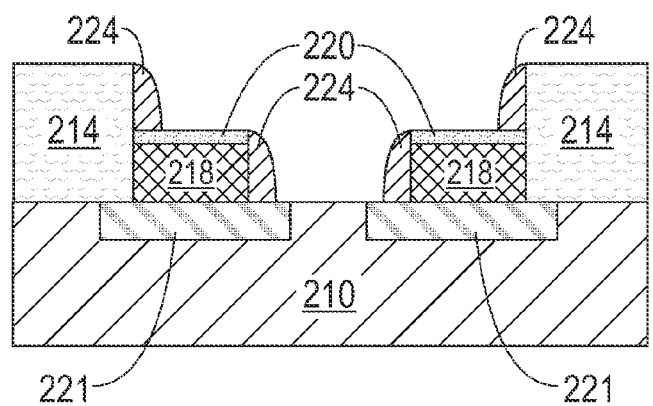
FIG. 14 is a pictorial representation (through a cross-sectional view) depicting the structure of FIG. 13 with a formed spacer, in accordance with another embodiment of the invention.

Referring to FIG. 14, there is a pictorial representation (through a cross-sectional view) depicting the structure of FIG. 13 with formed spacers 224, in accordance with an embodiment of the present invention. Formation of the spacers 224 is similar to the formation of dielectric spacers 124, discussed previously. The dielectric spacers 224 may include depositing a conformal layer (not shown) of insulating material, such as silicon nitride, silicon oxide, or silicon oxynitride, aluminum oxide, or hafnium oxide over the crystalline semiconductor substrate 210, the n-type dopant layer 218, and the thin layer of oxide 220. In an embodiment, an ALD process is used to deposit the spacers 224.

Figure 15:
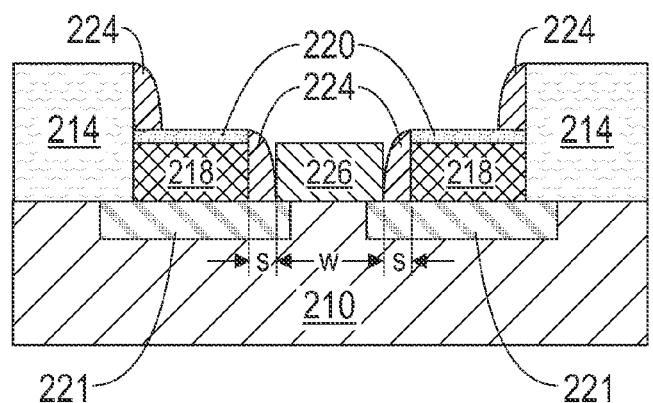
FIG. 15 is a pictorial representation (through a cross-sectional view) depicting the structure of FIG. 14 after growth of a p-type dopant layer between the n-type dopant layer and formed spacer from the exposed at least one portion of the surface of the crystalline semiconductor substrate, in accordance with another embodiment of the present invention.

Referring to FIG. 15, there is a pictorial representation (through a cross-sectional view) depicting the structure of FIG. 14 after growth of a p-type dopant layer 226 between the n-type dopant layer 218 and formed spacer 224 from the exposed at least one portion of the surface of the crystalline semiconductor substrate 210, in accordance with an embodiment of the present invention. Formation of a p-type dopant layer 226 is similar to the formation of p-type dopant layer 126, discussed previously. A thin layer of p-type dopant layer (not shown) is grown first to avoid direct contact between the n-type dopant layer 226 and the diffusion 221. In an alternative embodiment, a thin layer of N±α-SiH (not shown) may be deposited to improve transistor gain.

As shown in FIG. 15, the base width, w, of the p-type dopant layer is formed at sub-lithographic dimensions. The lithographic feature size or smallest dimension printed is represented by F. Unique to this invention, the base width is measurably smaller than F and is determined by the formula, w=F−2*s. The dielectric spacer width is s. Upon completion of the above described selective method of forming the bipolar junction transistor, electrical wiring contacts are formed to each base, emitter and collector, and then other devices and components may be formed on crystalline semiconductor substrate 210 and interconnected using one or more wiring layers. The formation of low resistance contact and patterned wiring layers follows methods known in the art.

Reference is now made to FIGS. 16-25, which illustrate a selective method of forming a bipolar junction transistor of the present invention. In the selective method, a patterned high-k dielectric material or passivation layer 314 is formed on an exposed surface of a crystalline semiconductor substrate 310. Next, an n-type dopant layer 318 is epitaxially grown from the exposed surfaces of the crystalline semiconductor substrate 310. Next, the high-k dielectric material or passivation layer 314 is etched adjacent the n-type dopant layers 318 to form at least one opening 319 to expose the surface of the crystalline semiconductor substrate 310. A thin oxide layer 320 is then created using thermal oxidation and diffusion 321 of the n-type dopant layers 318 occurs in the crystalline semiconductor substrate 310. In an embodiment, next a maskless isotropic time etching is performed to remove the thin oxide layer 320 on the crystalline semiconductor substrate 310 but leave the thin oxide layer 320 located on the n-type dopant layers 318. Next a high-k dielectric material 328 is deposited on both the crystalline semiconductor substrate 310 and the thin oxide layer 320. Alternatively, a masked isotropic time-etch can be performed to remove the thin oxide layer 320 that exposes at least one portion of the surface of the crystalline semiconductor substrate 310. Finally, a p-type dopant layer 326 is epitaxially grown between the n-type dopant layer and oxide layer from the exposed surface of the crystalline semiconductor substrate 310.

Figure 16:
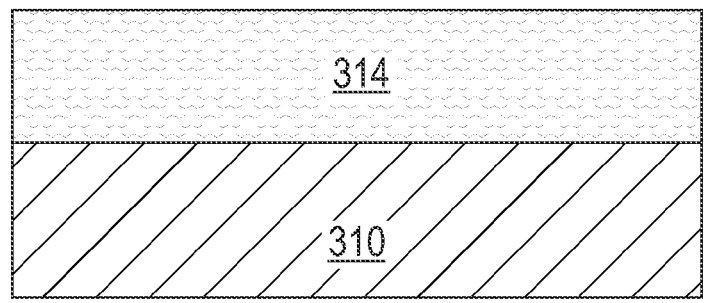
FIG. 16 is a pictorial representation (through a cross-sectional view) depicting a structure including a high-k dielectric material or passivation layer located atop a crystalline semiconductor substrate, in accordance with another embodiment of the present invention.

Referring to FIG. 16, there is a pictorial representation (through a cross-sectional view) depicting a structure including a high-k dielectric material or passivation layer 314 located atop a crystalline semiconductor substrate 310, in accordance with an embodiment of the present invention. Crystalline semiconductor substrate 310 is similar to crystalline semiconductor substrate 110 and crystalline semiconductor substrate 210, discussed previously. High-k dielectric material or passivation layer 314 is similar to high-k dielectric material 214 and passivation layer 114, discussed previously.

Figure 17:
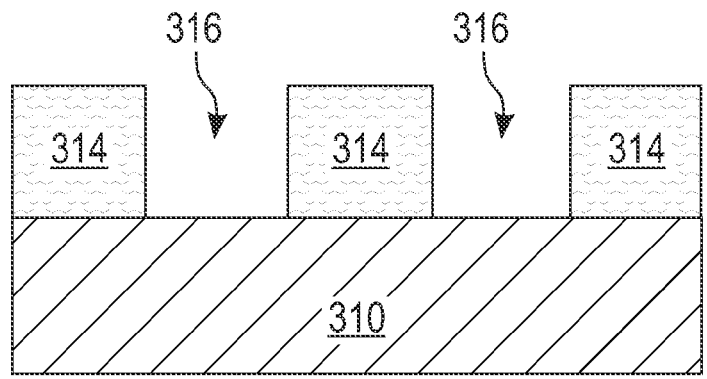
FIG. 17 is a pictorial representation (through a cross-sectional view) depicting the structure of FIG. 16 after forming at least one opening within the high-k dielectric material or passivation layer that exposes at least one portion of the surface of the crystalline semiconductor substrate, in accordance with another embodiment of the present invention.

Referring now to FIG. 17, there is a pictorial representation (through a cross-sectional view) depicting the structure of FIG. 16, after forming at least one opening 316 within the high-k dielectric material or passivation layer 314 that exposes at least one portion of the surface of the crystalline semiconductor substrate 310, in accordance with an embodiment of the present invention. The forming of at least one opening 316 is similar to the formation of the at least one opening 116 and the at least one opening 216, discussed previously.

Figure 18:
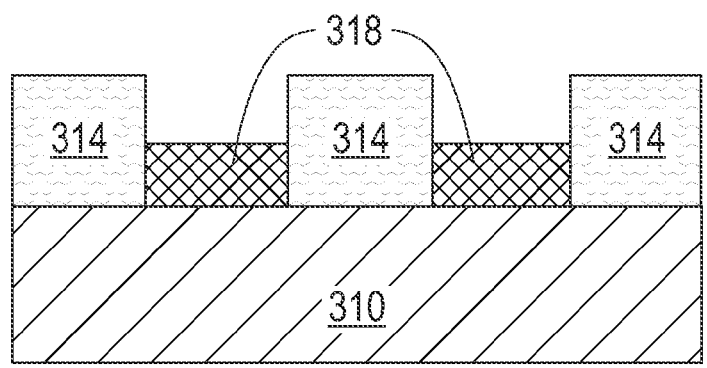
FIG. 18 is a pictorial representation (through a cross-sectional view) depicting the structure of FIG. 17 after growth of a n-type dopant layer in the at least one opening from the exposed portion of the surface of the crystalline semiconductor substrate, in accordance with another embodiment of the present invention.

Referring now to FIG. 18, there is a pictorial representation (through a cross-sectional view) depicting the structure of FIG. 17 after growth of a n-type dopant layer 318 in the at least one opening 316 from the exposed portion of the surface of the crystalline semiconductor substrate 310, in accordance with an embodiment of the present invention. The n-type dopant layer 318 is similar to the n-type dopant layer 118 and the n-type dopant layer 218, described previously, and is epitaxially grown in a similar fashion. The n-type dopant layer 218 may be formed to a height lower or higher than the height of the high-k dielectric material or passivation layer 314.

Figure 19:
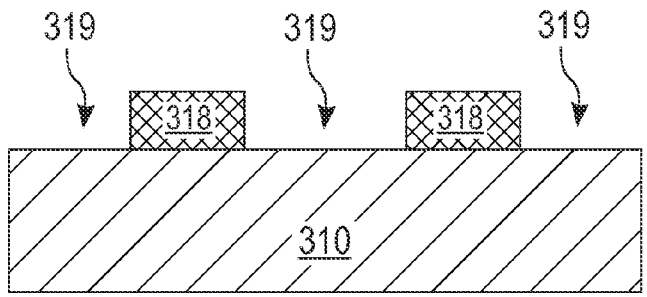
FIG. 19 is pictorial representation (through a cross-sectional view) depicting the structure of FIG. 18 after etching the high-k dielectric material or passivation layer adjacent to the n-type dopant layers to form at least one opening that exposes at least one portion of the surface of the crystalline semiconductor substrate, in accordance with another embodiment of the invention.

Referring now to FIG. 19, there is a pictorial representation (through a cross-sectional view) depicting the structure of FIG. 18 after etching the high-k dielectric material or passivation layer 314 adjacent the n-type dopant layer 318 to form at least one opening 319 that exposes at least one portion of the surface of the crystalline semiconductor substrate 310, in accordance with an embodiment of the present invention. The forming of at least one opening 319 is similar to the formation of the at least one opening 116, the at least one opening 216, and the at least one opening 316, discussed previously.

Figure 20:
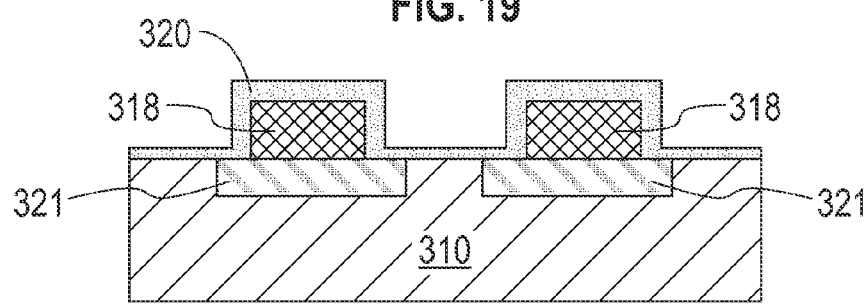
FIG. 20 is a pictorial representation (through a cross-sectional view) depicting the structure of FIG. 19 after thermal oxidation of the exposed n-type dopant layer and crystalline semiconductor substrate including diffusion into the crystalline semiconductor substrate, in accordance with another embodiment of the present invention.

Referring now to FIG. 20, there is a pictorial representation (through a cross-sectional view) depicting the structure of FIG. 19 after thermal oxidation of the exposed n-type dopant layer 318 and crystalline semiconductor substrate 310 including diffusion 321 into the crystalline semiconductor substrate 310, in accordance with an embodiment of the present invention. A thin layer of oxide 320 is formed on the surface of the n-type dopant layer 318 and the crystalline semiconductor substrate 310 in a similar manner as the previously discussed thin layer of oxide 220. The technique forces an oxidizing agent to create dopant diffusion 321 similar to dopant diffusion 221 into the crystalline semiconductor substrate 310 at high temperature. In an embodiment, the thin layer of oxide 320 is up to 30% thicker on the n-type dopant layer 318 than the crystalline semiconductor substrate 310.

Figure 21:
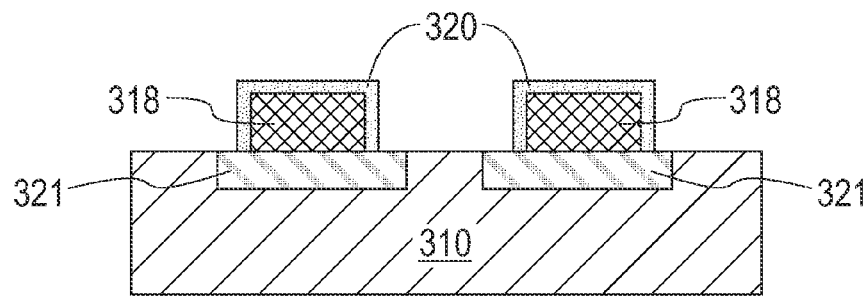
FIG. 21 is a pictorial representation (through a cross-sectional view) depicting the structure of FIG. 20 after maskless isotropic timed etching to remove oxide on the crystalline semiconductor substrate, but leaving oxide on the n-type dopant layer, in accordance with another embodiment of the present invention.

Referring now to FIG. 21, there is a pictorial representation (through a cross-sectional view) depicting the structure of FIG. 20 after maskless isotropic time etching to remove oxide on the crystalline semiconductor substrate 310 but leave oxide on the n-type dopant layer 318. The etching performs a function similar to the etching described above in FIG. 2, FIG. 6, and FIG. 13 but the removed dielectric is different from FIG. 2 and FIG. 6. The etching process allows the thin layer of oxide 320 to remain on the exposed top wall and sidewalls of the n-type dopant layer 318 and a section of the crystalline semiconductor substrate 310 adjacent the n-type dopant layer 318.

Figure 22:
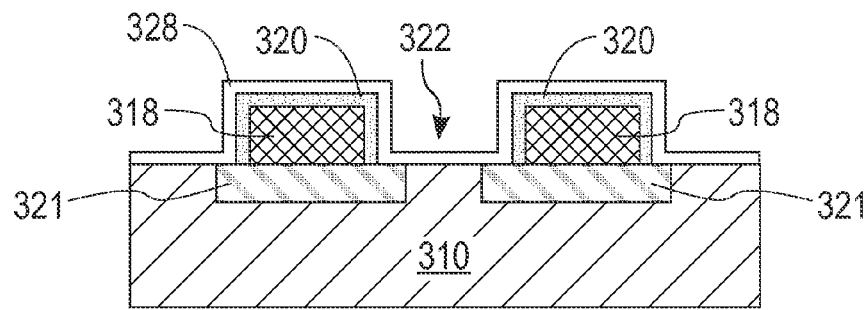
FIG. 22 is a pictorial representation (through a cross-sectional view) depicting depositing of a high-k dielectric material over the structure of FIG. 21, in accordance with another embodiment of the present invention.

Referring now to FIG. 22, there is a pictorial representation (through a cross-sectional view) depicting depositing of a high-k dielectric material 328 over the structure of FIG. 21, in accordance with an embodiment of the present invention. The high-k dielectric material 328 is similar to high-k dielectric material 120, discussed previously, and is deposited in a similar manner as high-k dielectric material 120, discussed previously. The high-k dielectric material 328 extends across the surface of the thin layer of oxide 320.

Figure 23:
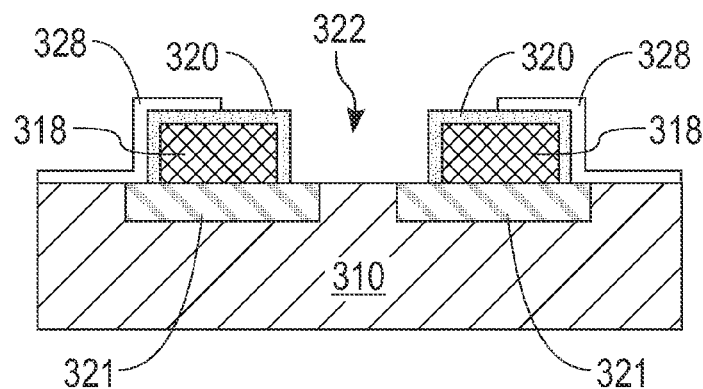
FIG. 23 is a pictorial representation (through a cross-sectional view) depicting the structure of FIG. 22 after etching a portion of the high-k dielectric material on the n-type dopant layers exposing a portion of the thin layer of oxide on each n-type dopant layer and etching the high-k dielectric material between the n-type dopant layers exposing the surface of the crystalline semiconductor substrate, in accordance with another embodiment of the present invention.

Referring now to FIG. 23, there is a pictorial representation (through a cross-sectional view), depicting the structure of FIG. 22 after etching a portion of the high-k dielectric material 328 on the n-type dopant layers 318 exposing a portion of the thin layer of oxide 320 on each n-type dopant layer 318 and etching the high-k dielectric material 328 between the n-type dopant layers 318 exposing the surface of the crystalline semiconductor substrate 310. The etching performed is similar to the etching described above in FIG. 2, FIG. 6, FIG. 13 and FIG. 21 but the moved dielectric is different than FIG. 2, FIG. 6, and FIG. 21. The etching process allows a portion of the high-k dielectric material 328 to remain on the thin layer of oxide 320 while exposing a portion of the thin layer of oxide 320. Additionally, the etching process exposes the crystalline semiconductor substrate 310 between the n-type dopant layers 318. In an embodiment, the opening 322, similar to opening 222 discussed previously, has a dimension larger than the base width, w, and optionally this dimension is equal to the lithographic feature size F.

Figure 24:
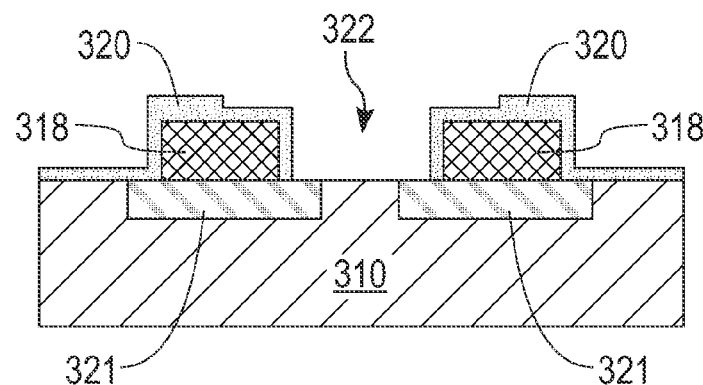
FIG. 24 is a pictorial representation (through a cross-sectional view) depicting the structure of FIG. 20 after masked isotropic time-etch to remove oxide between the n-type dopant layer that exposes at least one portion of the surface of the crystalline semiconductor substrate, in accordance with another embodiment of the invention.

Referring now to FIG. 24, there is a pictorial representation (through a cross-sectional view) depicting the structure of FIG. 20 after masked isotropic time-etch to remove part of the thin layer of oxide 320 between the n-type dopant layer 318 that exposes at least one portion of the surface of the crystalline semiconductor substrate, in accordance with an embodiment of the present invention. The etching performed is similar to the etching described above in FIG. 2, FIG. 6, FIG. 13, and FIG. 21 but the removed dielectric is different from FIG. 2 and FIG. 6. The etching removes part of the thin layer of oxide 320 located on top of the n-type dopant layers and removes the thin layer of oxide 320 located on the crystalline semiconductor substrate 310 between the n-type dopant layers 318 while leaving the thin layer of oxide 320 on the side walls of the n-type dopant layers. In an embodiment, the opening 322, similar to opening 222 discussed previously, has a dimension larger than the base width, w, and optionally this dimension is equal to the lithographic feature size F.

Figure 25:
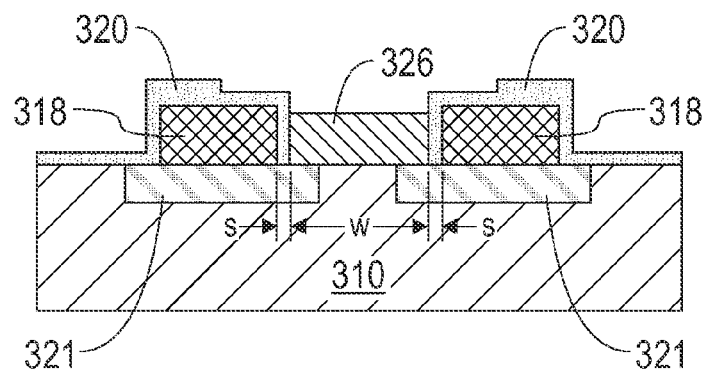
FIG. 25 is a pictorial representation (through a cross-sectional view) depicting the structure of FIG. 24 after growth of a p-type dopant layer between the n-type dopant layer and oxide layer from the exposed at least one portion of the surface of the crystalline semiconductor substrate, in accordance with another embodiment of the present invention.

Referring now to FIG. 25, there is a pictorial representation (through a cross-section view) depicting the structure of FIG. 24 after growth of a p-type dopant layer 326 between the n-type dopant layer 318 and the thin layer of oxide 320 from the exposed at least one portion of the surface of the crystalline semiconductor substrate 310, in accordance with an embodiment of the present invention. Formation of the p-type dopant layer 326 is similar to the formation of p-type dopant layer 126 and p-type dopant layer 226. In an alternative embodiment, the growth of the p-type dopant layer 326 can occur between the n-type dopant layer 318 and the thin layer of oxide 320 from the exposed at least one portion of the surface of the crystalline semiconductor substrate of the structure depicted in FIG. 22.

As shown in FIG. 25, the base width, w, of the p-type dopant layer is formed at sub-lithographic dimensions. The lithographic feature size or smallest dimension printed is represented by F. Unique to this invention, the base width is measurably smaller than F and is determined by the formula, w=F−2*s. The dielectric spacer width is s. Upon completion of the above described selective method of forming the bipolar junction transistor, electrical wiring contacts are formed to each base, emitter and collector, and then other devices and components may be formed on crystalline semiconductor substrate 310 and interconnected using one or more wiring layers. The formation of low resistance contacts and patterned wiring layers follows methods known in the art.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

What is claimed is:

1. A bipolar junction transistor comprising:
   a semiconductor layer disposed on an insulating material, at least a portion of the semiconductor layer forming a base region;
   a transistor emitter laterally disposed on a first side of the base region, wherein the transistor emitter is a first doping type and has a first width, and wherein the first width is a lithographic feature size;
   a transistor collector laterally disposed on a second side of the base region, wherein the transistor collector is the first doping type and has the first width; and
   a central base contact laterally disposed on the base region between the transistor emitter and the transistor collector, wherein the central base contact is a second doping type and has a second width, and wherein the second width is a sub-lithographic feature size.

2. The bipolar junction transistor of claim 1, further comprising:
   at least one dielectric spacer disposed on the base region having a third width, wherein the dielectric spacer is located in one or more of the following locations: between the transistor emitter and central base contact or between the transistor collector and central base contact.

3. The bipolar junction transistor of claim 2, wherein the second width can be defined by the first width minus two times the third width.

4. The bipolar junction transistor of claim 3, wherein the first width is between 10 nm and 100 nm.

5. The bipolar junction transistor of claim 3, wherein the sub-lithographic feature size is between 2 nm and 98 nm.

6. The bipolar junction transistor of claim 3, wherein the transistor emitter and transistor collector are one of: a p-type doped layer or an n-type doped layer.

7. The bipolar junction transistor of claim 6, wherein the transistor emitter and transistor collector have a doping concentration between $5\times10^{18}/cm^3$ and $5\times10^{20}/cm^3$.

8. The bipolar junction transistor of claim 2, wherein the at least one dielectric spacer comprises one or more of the following: silicon nitride, silicon oxide, or silicon oxynitride, aluminum oxide, or hafnium oxide.

9. The bipolar junction transistor of claim 1, further comprising:
   a semiconductor carrier substrate, wherein the insulating material is a buried insulator disposed on the semiconductor carrier substrate.

* * * * *